(12) United States Patent
Shen

(10) Patent No.: US 7,408,370 B2
(45) Date of Patent: Aug. 5, 2008

(54) LIGHTING DEVICE

(76) Inventor: Yu-Nung Shen, No. 60, Lane 328, Li-Shan Street, Nei-Hu Dist., Taipei City (TW)

( * ) Notice: Subject to any disclaimer, the term of this patent is extended or adjusted under 35 U.S.C. 154(b) by 245 days.

(21) Appl. No.: 11/375,342

(22) Filed: Mar. 15, 2006

(65) Prior Publication Data

US 2007/0001709 A1  Jan. 4, 2007

(51) Int. Cl.
*G01R 31/26* (2006.01)
(52) U.S. Cl. ...................................... 324/765
(58) Field of Classification Search ................ None
See application file for complete search history.

(56) References Cited

U.S. PATENT DOCUMENTS 6,249,370 B1 * 6/2001 Takeuchi et al. ............. 359/291
7,169,005 B2 * 1/2007 Hayashi et al. ............... 445/26
2005/0179352 A1 * 8/2005 Hayashi et al. ............... 313/44
2005/0255784 A1 * 11/2005 Hayashi et al. ............... 445/39

* cited by examiner

*Primary Examiner*—Jermele M Hollington
(74) *Attorney, Agent, or Firm*—Houston Eliseeva LLP

(57) ABSTRACT

A lighting device includes a light-guiding rod and a light-emitting unit. The light-guiding rod includes a transparent hollow housing, the housing has two open ends and two insulating plugs for closing corresponding said two open ends. The light-emitting unit includes a transparent light-guiding plate, at least one light-emitting diode, a mounting substrate, and a plurality of conductive bumps. The transparent light-guiding plate is disposed in said housing. At least one light-emitting diode has a light-emitting surface; the surface is attached to a lower surface of said light-guiding plate. The mounting substrate has a wiring surface and a plurality of electric traces. A plurality of conductive bumps for connecting electrically said electric contacts of said at least one light-emitting diode to corresponding said electric traces in such a manner that said at least one light-emitting diode is mounted on said wiring surface of said mounting substrate.

16 Claims, 9 Drawing Sheets

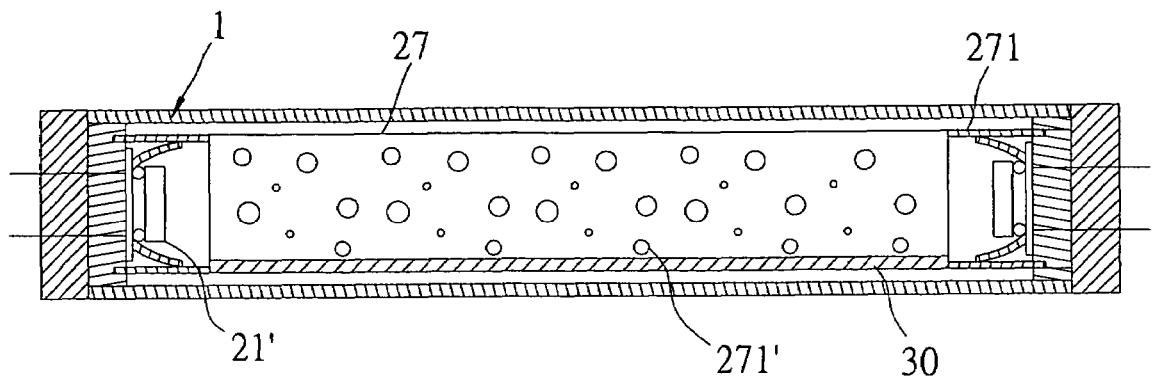
FIG 19
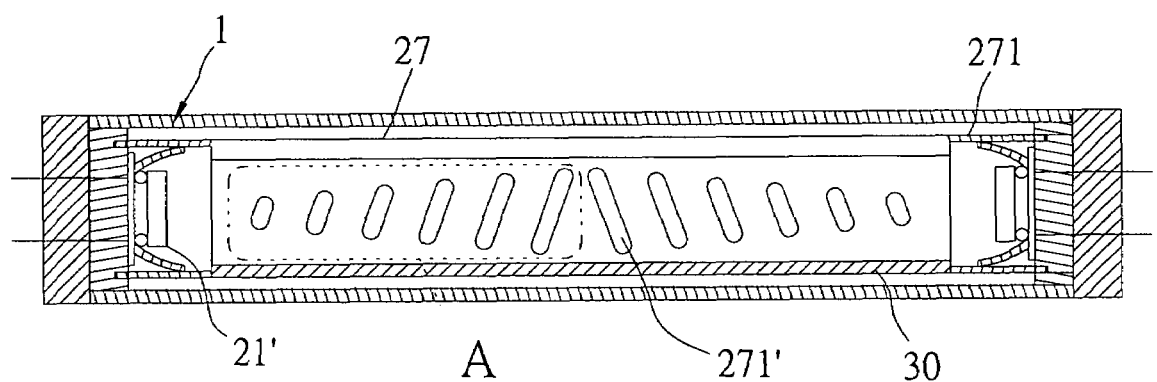
FIG 20
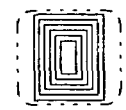  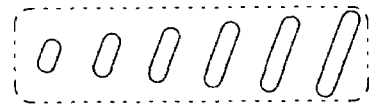
FIG 20B              FIG 20A

LIGHTING DEVICE

BACKGROUND OF THE INVENTION

1. Field of the Invention

The present invention relates to a lighting device, and more particularly, to a lighting device with low power consumption, high brightness and long life span.

2. Description of Related Art

Presently, incandescent lamp and fluorescent lamp are popularly used as lighting device, especially used in indoor. In consideration of price, life span and power consuming, fluorescent lamp is more preferred. However, light emitting diodes are recently under vigorous research and development as potential replacements for the aforementioned lamps.

SUMMARY OF THE INVENTION

The object of the present invention is to provide a lighting device with low power consumption, high brightness and long life span.

According to one aspect of the present invention, a lighting device includes: a light-guiding rod including a transparent hollow housing having two open ends and two insulating plugs for closing the corresponding open ends, each of the plugs having an inner surface and a supporting slot formed on the inner surface; and a light-emitting unit including a transparent light-guiding plate disposed in the housing and having two end portions each extending into the supporting slot of a corresponding one of the plugs, at least one light-emitting diode, the at least one light-emitting diode having a light-emitting surface attached to a lower surface of the light-guiding plate, a non-light-emitting surface opposed to the light-emitting surface, and a plurality of electric contacts provided on the non-light-emitting surface, a mounting substrate having a wiring surface and a plurality of electric traces formed on the wiring surface, and a plurality of conductive bumps for connecting electrically the electric contacts of the at least one light-emitting diode to corresponding the electric traces in such a manner that the at least one light-emitting diode is mounted on the wiring surface of the mounting substrate.

According to another aspect of the present invention, a lighting device includes: a light-guiding rod including a transparent hollow housing having two open ends and two insulating plugs for closing corresponding the two open ends, each of the plugs having an inner surface and a supporting slot form on the inner surface; and a light-emitting unit including a transparent light-guiding plate disposed in the housing and having two end portions each extending into the supporting slot of a corresponding one of the plugs, the light-guiding plate having a lower surface and a plurality of electric traces formed on the lower surface, at least one light-emitting diode, the at least one light-emitting diode having a light-emitting surface and a plurality of electric contacts provided on the light-emitting surface, and a plurality of conductive bumps for connecting electrically the electric contacts of the at least one light-emitting diode to corresponding the electric traces on the lower surface of the light-guiding plate in such a manner that the at least one light-emitting diode is mounted on the lower surface of the light-guiding plate.

According to still another aspect of the present invention, a lighting device includes: a light-guiding rod including a transparent hollow housing having two open ends and two insulating plugs for closing corresponding the two open ends; and a light-emitting unit including at least one mounting substrate having a wiring surface, a plurality of electric traces formed on the wiring surface, and a back surface which is opposed to the wiring surface and which is attached to an inner surface of a corresponding one of the plugs, at least one light-emitting diode, the at least one light-emitting diode having a light-emitting surface, a non-light-emitting surface opposed to the light-emitting surface, and a plurality of electric contacts provided on the light-emitting surface, and a plurality of conductive bumps for connecting electrically the electric contacts of the at least one light-emitting diode to corresponding the electric traces on the wiring surface of the mounting substrate in such a manner that the at least one light-emitting diode is mounted on the wiring surface of the mounting substrate.

According to a further aspect of the present invention, a lighting device includes: a light-guiding rod including a transparent housing, the housing having an inner surface and a reflecting layer formed on the inner surface; and a light-emitting unit operable to emit light into the light-guiding rod through two end of the light-guiding rod, wherein the reflecting layer has a width widen than that of the end portions of the same.

BRIEF DESCRIPTION OF THE DRAWINGS

FIG. 19 is a schematic diagram illustrating a semiconductor chip package according to a ninth embodiment of the present invention;

FIG. 20 is a schematic diagram illustrating a semiconductor chip package according to a tenth embodiment of the present invention;

FIG. 20A is a schematic diagram illustrating a semiconductor chip package according to a tenth embodiment of the present invention;

FIG. 20B is a schematic diagram illustrating a semiconductor chip package according to a tenth embodiment of the present invention;

DETAILED DESCRIPTION OF THE PREFERRED EMBODIMENTS

Preferred embodiments of the present invention will be described below with reference to the accompanying drawings.

It should be noted that the same numeral is used to indicate the same element throughout the whole specification. Furthermore, the elements are not drawn to scale so as to clearly show the features of the present invention.

Figure 1:
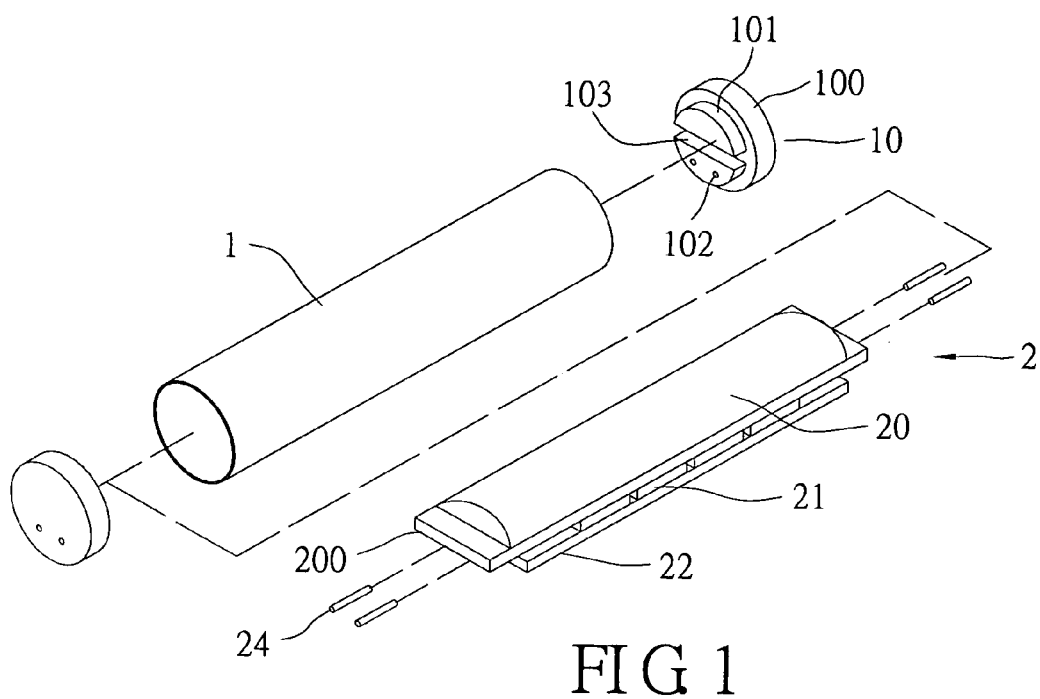
FIGS. 1 to 4 are schematic diagrams illustrating a semiconductor chip package according to a first embodiment of the present invention.
Figure 2:
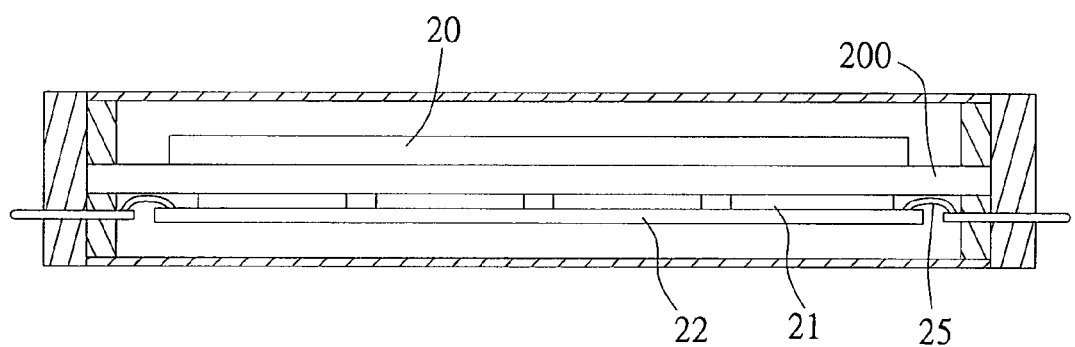

Referring to FIGS. 1 and 2, a lighting device according to a first embodiment of the present invention includes a light-guiding rod 1 and a light-emitting unit 2.

In the present embodiment, the light-guiding rod 1 includes a housing 11 which is formed from a material similar to that for a housing of a fluorescent lamp. However, it should be noted that the housing 11 could be formed from any other suitable material, for example, a material for a housing of a CCFL. On the other hand, in the present embodiment, the housing 11 is shown to have a tubular shape, however, the housing 11 may have any other suitable shape.

The housing 11 has two open ends and two insulating plugs 10 for closing the open ends respectively. Each of the plugs 10 has a body portion 100 outside the housing 11, a horizontally-extending portion 101 extending from an inner surface of the body portion 100 into the housing 11 so as to prevent disengagement of the plug 10 from the housing 11, and a pair of through-holes 102 penetrating the body portion 100 and the horizontally-extending portion 101. In the present embodiment, a supporting slot 103 is formed on an inner surface of the horizontally-extending portion 101 of each of the plugs 10.

Figure 3:
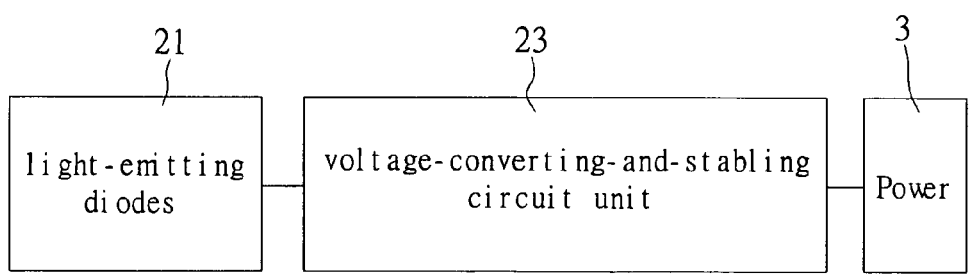
Figure 5:
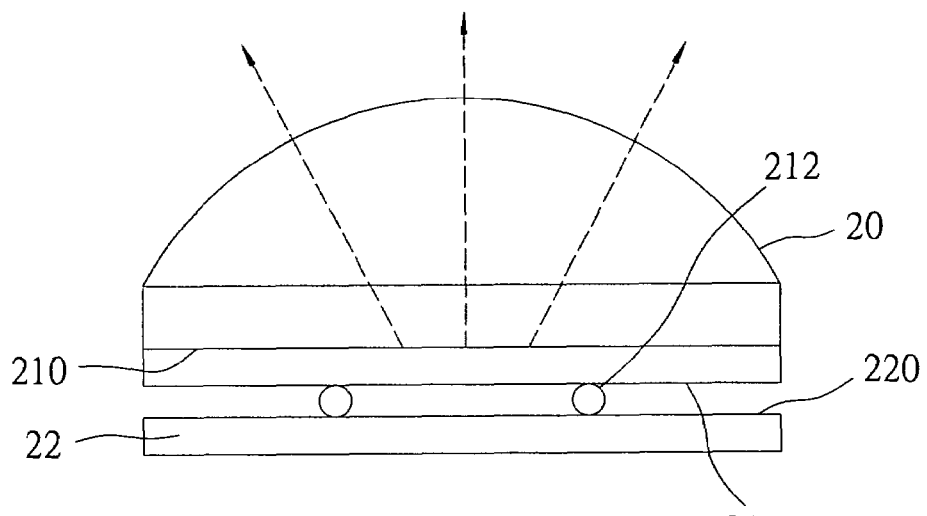
FIGS. 5 to 8 are schematic diagrams illustrating a semiconductor chip package according to a second embodiment of the present invention.

Referring to FIGS. 3 and 5, the light-emitting unit 2 includes a transparent light-guiding plate 20, a plurality of light-emitting diodes 21, a mounting substrate 22, a voltage-converting-and-stabling circuit unit 23 and two pairs of power supply electrode 24.

In the present embodiment, the light-guiding plate 20 has a round top surface such that the lighting device may have a wide lighting angle. The light-guiding plate 20 can be formed from any suitable transparent material, such as glass, acrylic and the like. The plate 20 further has two horizontally-extending tabs 200. Each of the tabs 200 extends into the supporting slot 103 of a corresponding one of the horizontally-extending portion 101 so as to fix the light-guiding plate 20 in the housing 11.

The light-emitting diodes 21 may be the ones available on the market. In the present embodiment, each of the light-emitting diodes 21 has a light-emitting surface 210, a non-light-emitting surface 211 opposed to the light-emitting surface 210, and a plurality of electric contacts (not shown) provided on the non-light-emitting surface 211. Each of the light-emitting diodes 21 is attached to the light-guiding plate 20 with an adhesive agent (not shown) between its light-emitting surface 210 and a bottom surface of the plate 20 opposed to the top surface.

The mounting substrate 22 may be a flexible circuit board, a rigid circuit board, or a substrate adapted to form electrical traces on the surface thereof. The mounting substrate 22 has a wiring surface 220 on which electrical traces (not shown) are mounted. The light-emitting diodes 21 are mounted on the wiring surface 220 in a flip-chip manner with their non-light-emitting surfaces 211 facing the wiring surface 220 of the substrate 22 such that electric contacts on the non-light-emitting surface 210 are connected electrically to the corresponding electric traces via conductive bumps 212.

Each electrode 24 of each pair of power supply electrodes 24 extends through a corresponding one of the through-holes 102 of a corresponding one of the plugs 10 in such a manner that one end portion thereof is outside the housing 11 and the other end portion thereof is inside the housing 11. The electrodes 24 are connected electrically to the corresponding traces on the wiring surface 220 of the substrate 22 via conductors 25 such as conductive wires, and are adapted to be connected with external electrical connectors (not shown) so as to be supplied with external supply voltage. For example, the electrodes 24 can be connected electrically with standard fluorescent lamp sockets.

In the present embodiment, the voltage-converting-and-stabling circuit unit 23 is provided on the wiring surface 220 of the substrate 22 and is connected electrically to the light-emitting diodes 21. The voltage-converting-and-stabling circuit unit 23 is supplied with AC supply voltage via the electrodes 24 and outputs a driving voltage for the light-emitting diodes 21.

It should be noted that the voltage-converting-and-stabling circuit unit 23 is not limited to be provided on the wiring surface 220 of the substrate 22, but is capable of being provided on any other suitable element. Furthermore, since the voltage-converting-and-stabling circuit unit 23 is well known in the art, detailed description thereof is omitted herein.

As described above, since the electrodes 24 can be connected with standard fluorescent lamp sockets, it is possible to easily replace the fluorescent lamp with the lighting device of the present invention. Furthermore, the lighting device of the present invention can be used as the light source for LCD. That is to say, the lighting device of the present invention can be used in a backlight assembly for LCD.

It should be noted that when the mounting substrate 22 is a rigid carrier, the end portions thereof could extend into the slot 103 of the plug 10 such that the tabs 200 can be omitted.

Figure 4:
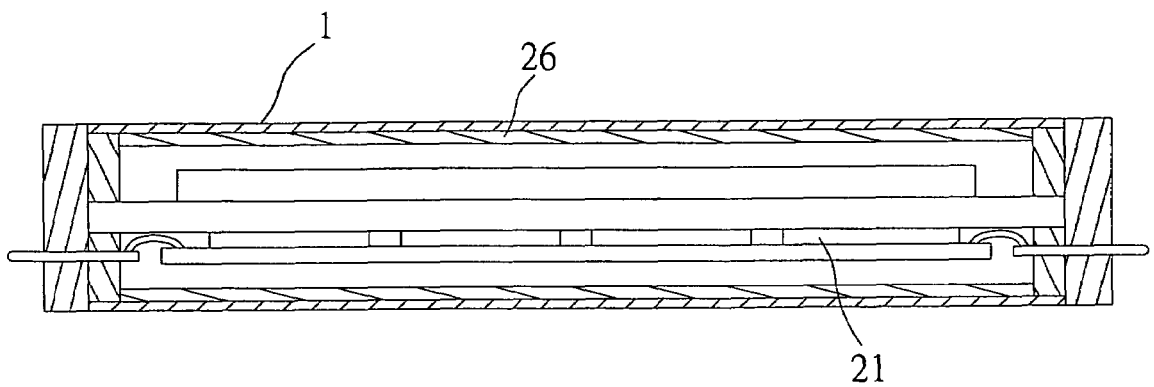

Referring to FIG. 4, a fluorescent layer 26 can be formed on an inner surface of the housing 11 such that the wavelength of the light passing therethrough can be varied in order to obtain a desired color.

Figure 6:
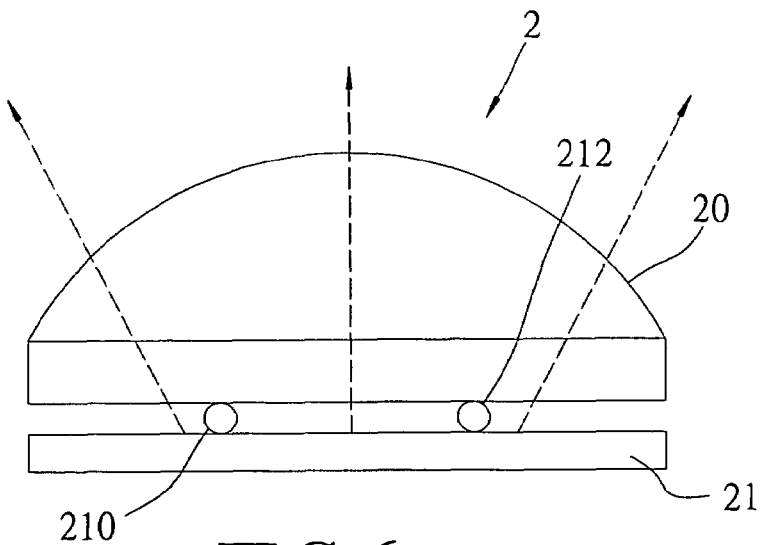

FIG. 6 is a schematic side view showing a light-emitting unit 2 of a lighting device according to a second embodiment of the present invention.

Unlike to the first embodiment, the mounting substrate 22 is omitted in the present invention. A plurality of electric traces (not shown) is provided on the bottom surface of the light-guiding plate 20. The light-emitting diodes 21 have electric contacts (not shown) provided on the light-emitting surfaces 210 thereof and are mounted on the bottom surface of the plate 20 in flip-chip manner with their light-emitting surface 210 facing the wiring surface 220 of the substrate 22 such that electric contacts on the light-emitting surface 210 are connected electrically to the corresponding electric traces on the bottom surface of the plate 20 via conductive bumps 212.

Figure 7:
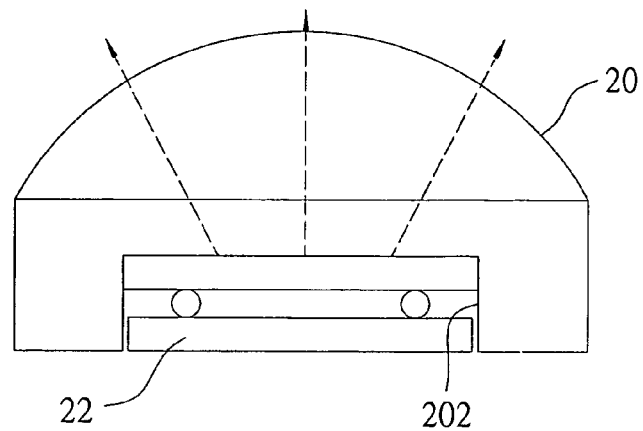

FIG. 7 is a schematic side view showing a light-emitting unit 2 of a lighting device according to a third embodiment of the present invention.

Unlike to the first embodiment, a pair of vertically-extending walls 202 spaced with each other is formed on the bottom surface of the light-guiding plate 20 in such a manner that the light-emitting diodes 21 and the mounting substrate 22 are located between the vertically-extending walls 202.

Figure 8:
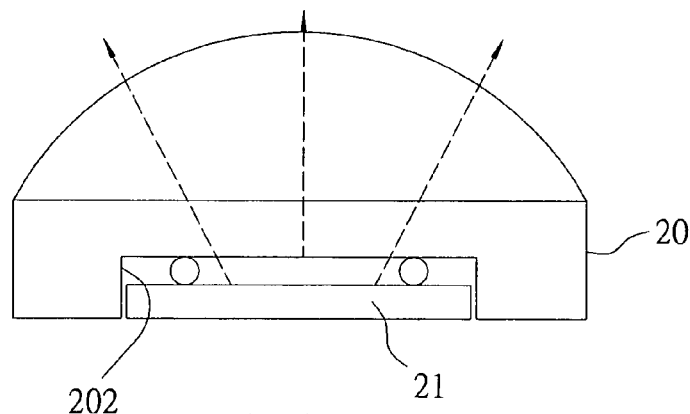

FIG. 8 is a schematic side view showing a light-emitting unit 2 of a lighting device according to a fourth embodiment of the present invention.

Unlike to the second embodiment, a pair of vertically-extending walls 202 spaced with each other is formed on the bottom surface of the light-guiding plate 20 in such a manner that the light-emitting diodes 21 are located between the vertically-extending walls 202.

Figure 9:
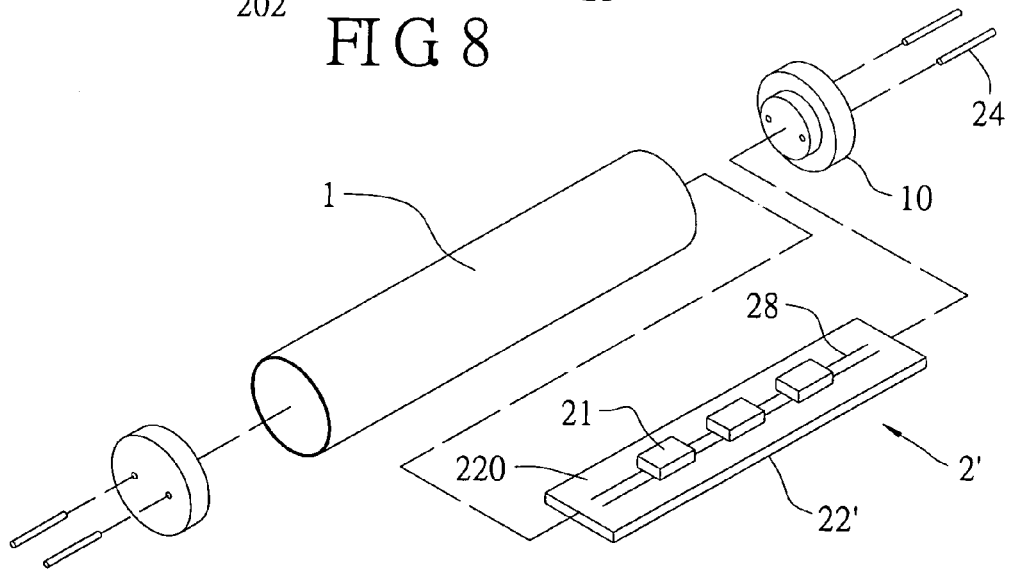
FIGS. 9 and 10 are schematic diagrams illustrating a semiconductor chip package according to a third embodiment of the present invention.
Figure 10:
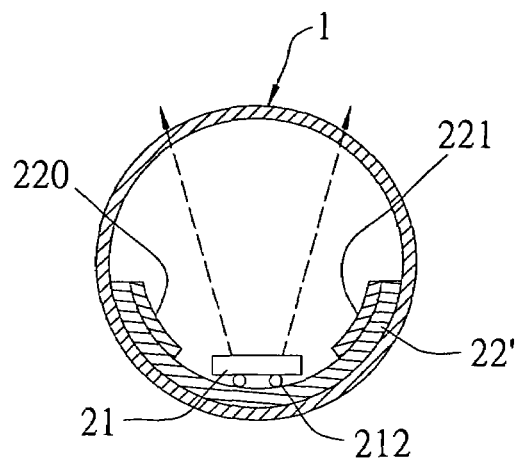

FIG. 9 is a schematic exploded perspective diagram showing a lighting device according to a fifth embodiment of the present invention, and FIG. 10 is a schematic sectional diagram showing the lighting device shown in FIG. 9.

The lighting device includes a light-guiding rod 1 and a light-emitting unit 2'.

The light-guiding rod 1 includes a housing 11 similar to that of the first embodiment, and thus the detailed description thereof is omitted herein.

In the present embodiment, the plugs 10 are similar to those in the first embodiment except that the supporting slots 103 are omitted, and thus, detailed description thereof is omitted herein.

The light-emitting unit 2' includes a mounting substrate 22', a plurality of light-emitting diodes 21, a voltage-converting-and-stabling circuit unit (not shown) and two pairs of power supply electrode 26.

The mounting substrate 22' is a flexible opaque substrate and is compliantly mounted on the inner surface of the housing 11. The mounting substrate 22' has a wiring surface 220 on which electric traces 28 are formed and a reflecting layer 221 (see FIG. 10) provided on the portions of the surface 220 not covered by the traces 28. Similar to the first embodiment, the traces 28 on the surface 220 of the mounting substrate 22' are connected electrically to the electrodes 24 via conductors (not shown).

Similar to the first embodiment, the light-emitting diodes 21 are mounted on the mounting substrate 22' in a flip-chip manner such that the electric contacts (not shown) of the diodes 21 are connected electrically with corresponding traces 28.

In the present embodiment, the structure and functions of the voltage-converting-and-stabling circuit unit are as same as those of the voltage-converting-and-stabling circuit unit described in the first embodiment and thus, detailed descriptions thereof are omitted herein.

Figure 11:
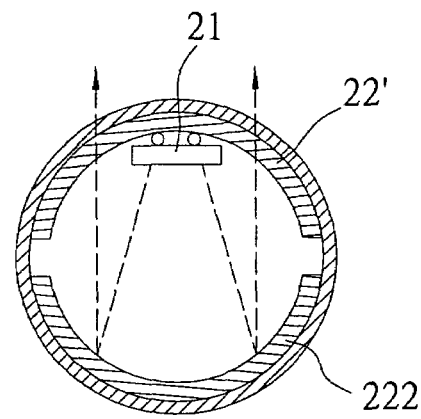
FIGS. 11 to 14 are schematic diagrams illustrating a semiconductor chip package according to a fourth embodiment of the present invention.

FIG. 11 is a schematic sectional diagram showing a lighting device according to a sixth embodiment of the present invention.

As shown in FIG. 11, unlike to the fifth embodiment, the mounting substrate 22' of the present embodiment is a flexible transparent substrate and no reflecting layer is provided on the surface thereof. A reflecting layer 222 is formed on a portion of the inner surface of the housing 11 opposite to the mounting substrate 22' so as to reflect the light emitted from the diodes 21.

Figure 12:
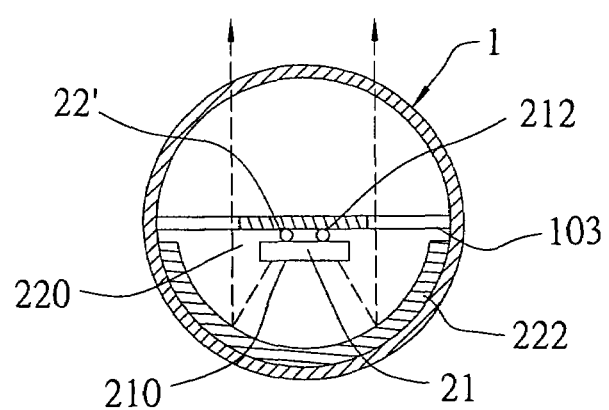

FIG. 12 is a schematic sectional diagram showing a lighting device according to a seventh embodiment of the present invention.

Referring to FIG. 12, unlike to the fifth and sixth embodiment, in the present embodiment, the plugs 10 are similar to those described in the first embodiment and thus, detailed descriptions thereof are omitted herein. The mounting substrate 22' is a rigid transparent substrate and two end portions thereof extend into the corresponding support slots 103 of the plugs 10. The mounting substrate 22' has an electric trace mounting surface 220 on which electric traces (not shown) are mounted.

Similar to the first embodiment, the light-emitting diodes 21 are mounted on the surface 220 of the mounting substrate 22' in a flip-chip manner. A reflecting layer 222 is formed on the portion of the inner surface of the housing 11 opposite to the light-emitting surfaces of the light-emitting diodes 21.

Figure 13:
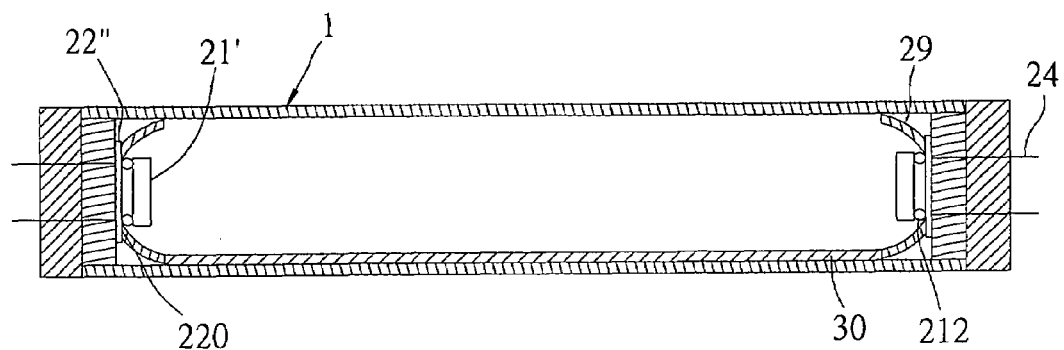

FIG. 13 is a schematic sectional diagram showing a lighting device according to an eighth embodiment of the present invention.

As shown in FIG. 13, the lighting device of the present embodiment includes a light-guiding rod 1 and a light-emitting unit 2.

The light-guiding rod 1 includes a housing 11 similar to that described in the first embodiment and thus, detailed description thereof is omitted herein. Unlike to the first embodiment, an axially-extending reflecting layer 30 is formed on a portion of the inner surface of the housing 11.

Figure 21:
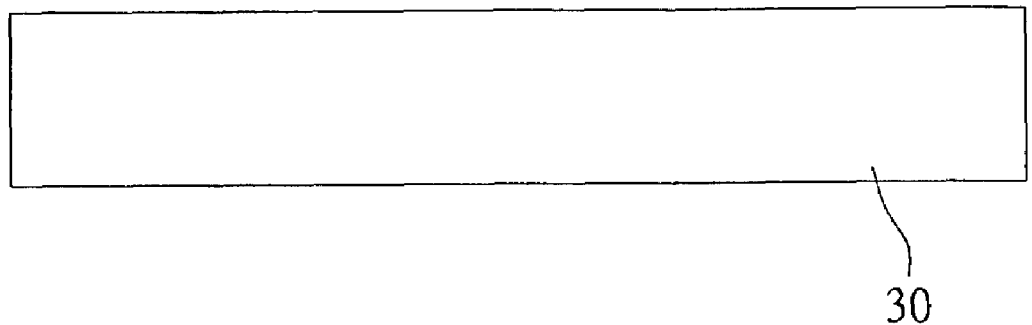
FIG. 21 is a schematic diagram illustrating an upper surface of the topmost semiconductor chip in a stacked semiconductor chip package according to the present invention.
Figure 22:
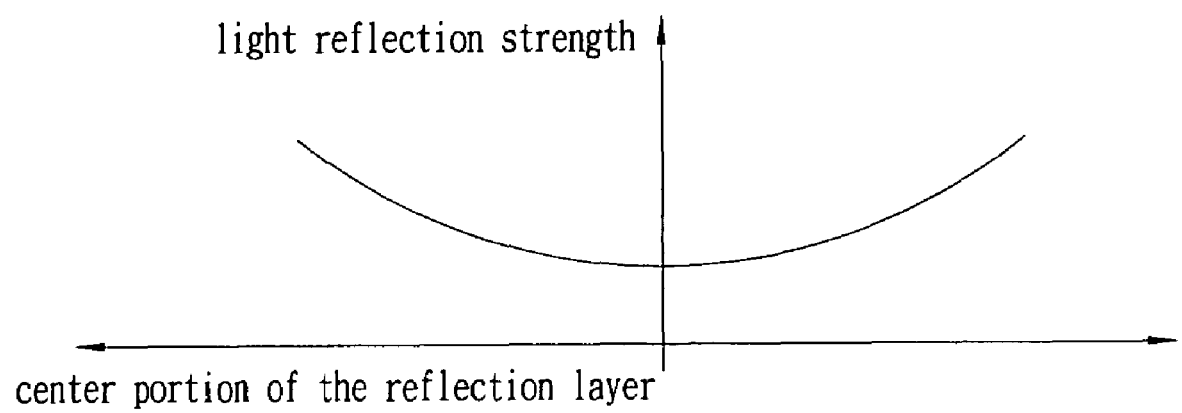
FIG. 22 is a schematic diagram illustrating a semiconductor chip package according to an eleventh embodiment of the present invention.
Figure 23:
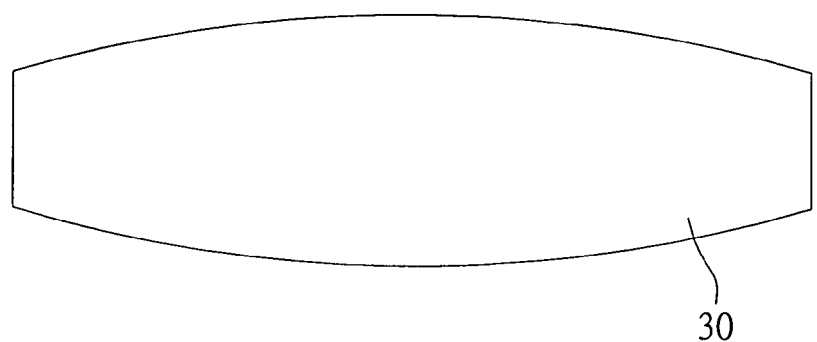
FIG. 23 is a schematic diagram illustrating a semiconductor chip package according to a twelfth embodiment of the present invention.
Figure 24:
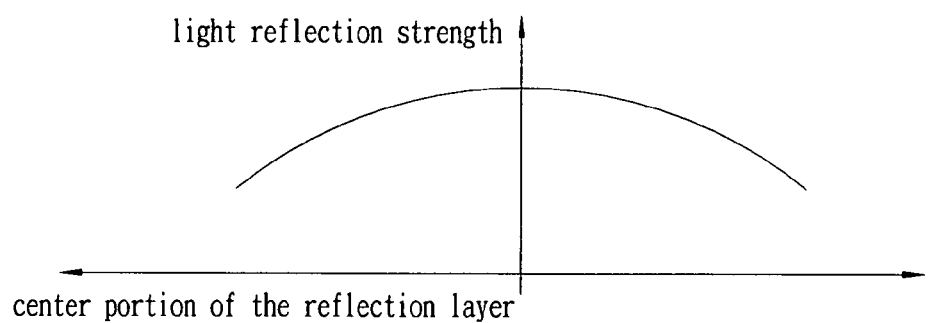
FIG. 24 is a schematic diagram illustrating a semiconductor chip package according to a thirteenth embodiment of the present invention.
Figure 25:
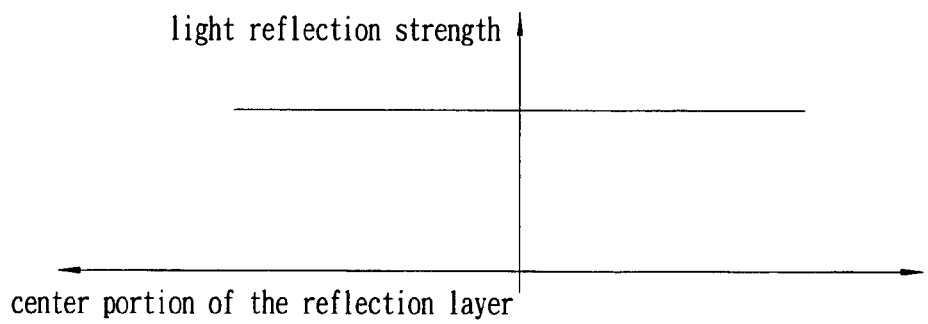
FIG. 25 is a schematic diagram illustrating a semiconductor chip package according to a fourteenth embodiment of the present invention.

As shown in FIGS. 21 and 22, the reflecting layer 30 in the present embodiment may have a rectangular shape. However, the reflecting layer 30 having such a rectangular shape may arise a problem that the intensity of the light reflected by the central portion of the reflecting layer 30 is lower than that reflected by the end portions of the same when the light sources are located at two ends of the reflecting layer 30. It is because the more far away from the light source, the weaker the intensity of the light emitted from the light source is. To solve this problem, the reflecting layer 30 having a shape shown in FIG. 23 may be used. If the intensity of the light will not vary no matter how far away from the light source, the curve of intensity of the light reflected by the reflecting layer 30 vs. the distance is the one shown in FIG. 24. That is to say, the reflecting layer 30 shown in FIG. 23 has a function of compensating the reflective intensity of the central portion, since the width of the central portion of the reflecting layer 30 in FIG. 23 is widen than that of the end portions of the same such that the intensity of the light reflected by the central portion of the reflecting layer 30 is as same as that reflected by the end portions of the same. As such, the curve of intensity of the light reflected by the reflecting layer 30 shown in FIG. 23 vs. the distance is the one shown in FIG. 25.

The light-emitting unit 2 includes two mounting substrate 22", two light-emitting diodes 21', two reflective cups 29 and two voltage-converting-and-stabling circuit unit (not shown).

Each of the mounting substrates 22" is a metal-based substrate which is composed of metal layers and insulating layers that are intervened with each other and which has an improved performance in heat dispersion. Each mounting substrate 22" has an electric trace mounting surface 220 on which electric traces (not shown) are mounted and is attached to the inner surface of a corresponding one of the plugs 10. The electric traces of the mounting substrates 22" are electrically connected to the corresponding electrodes 24.

Each of the light-emitting diodes 21' is mounted on the surface 220 of a corresponding one of the mounting substrate 22" in a flip-chip manner. The heat generated during the operation of the diodes 21' can be dispersed through the mounting substrate 22".

Each of the reflective cups 29 is mounted on a corresponding one of the mounting substrate 22" surrounding the corresponding diode 21' so as to reflect the light emitted from the diode 21'.

The voltage-converting-and-stabling circuit units receive an external voltage and generate driving voltages for the corresponding light-emitting diodes 21'. Since the structure and functions of the voltage-converting-and-stabling circuit units are as same as those of the voltage-converting-and-stabling circuit unit described in the first embodiment and thus, detailed descriptions thereof are omitted herein.

Figure 14:
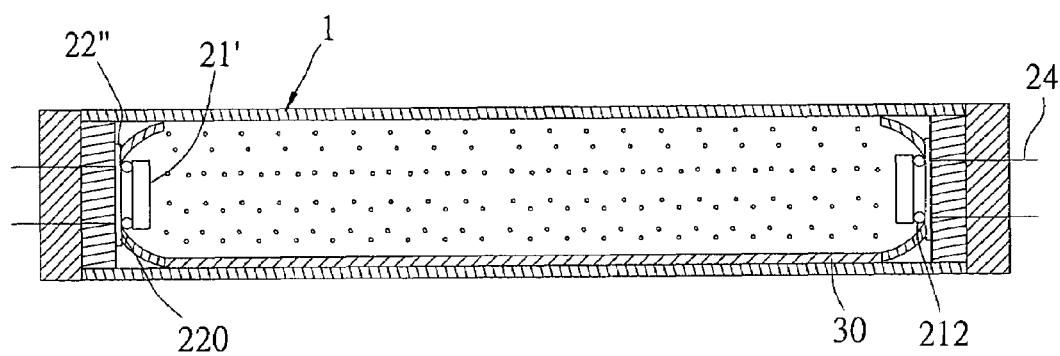
Figure 15:
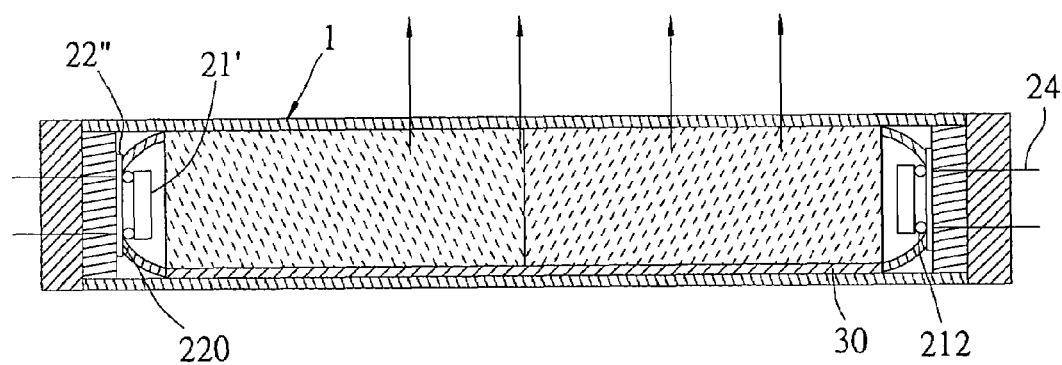
FIG. 15 is a schematic diagram illustrating a semiconductor chip package according to a fifth embodiment of the present invention.

FIGS. 14 and 15 are schematic sectional diagrams showing a lighting device according to a ninth embodiment of the present invention.

Unlike to the eighth embodiment, the housing 11 of the present embodiment is filled with inert gas such as xenon or liquid dye such as polarizing dye or fluorochrome (shown as circles in FIG. 14). Alternatively, the housing 11 is filled with optical fibers (shown as short lines in FIG. 15). One end of each of the fibers is provided with fluorescent material.

Figure 16:
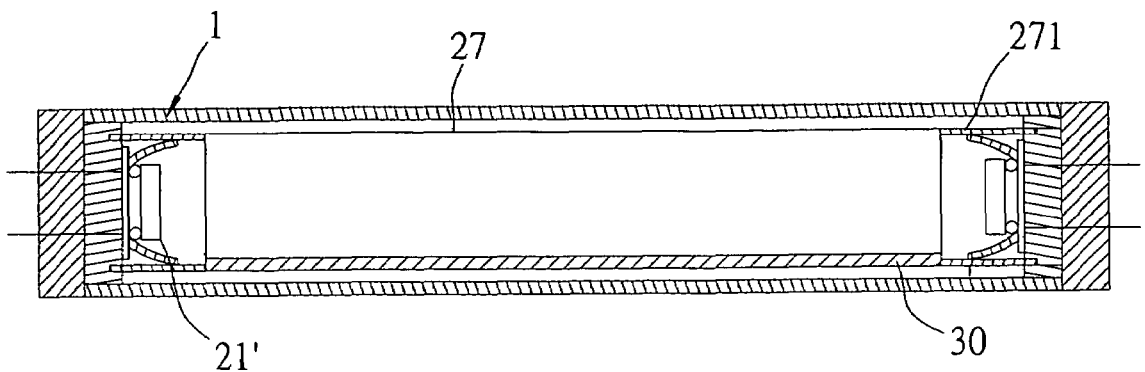
FIG. 16 is a schematic diagram illustrating a semiconductor chip package according to a sixth embodiment of the present invention.
Figure 17:
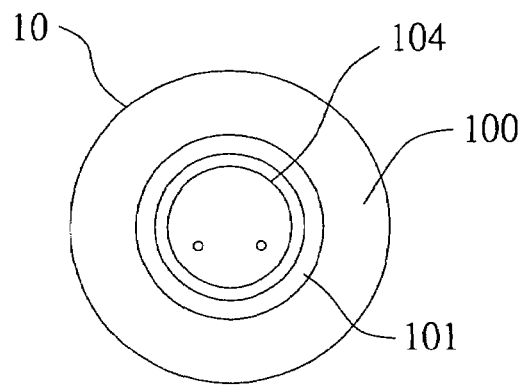
FIG. 17 is a schematic diagram illustrating a semiconductor chip package according to a seventh embodiment of the present invention.

FIG. 16 is a schematic sectional diagram showing a lighting device according to a tenth embodiment of the present invention.

Referring to FIG. 16, unlike to the eighth embodiment, the inner surface of the horizontally-extending portion 101 of each of the plugs 10 is formed with an annular groove 104 (see FIG. 7).

Figure 18:
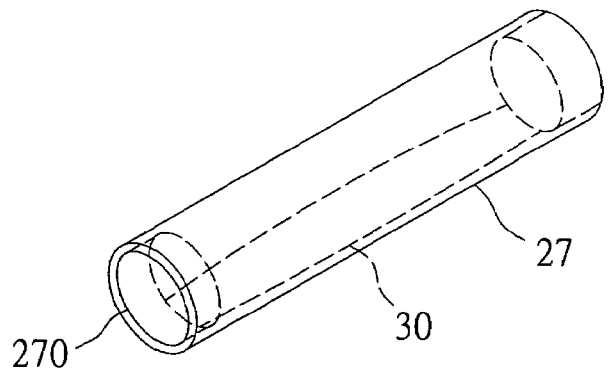
FIG. 18 is a schematic diagram illustrating a semiconductor chip package according to a eighth embodiment of the present invention.

Referring to FIG. 18, the lighting device of the present embodiment further includes a cylindrical transparent light-guiding bar 27 having an inner surface on which a reflecting layer 30 is formed. The light-guiding bar 27 has two end portions each formed with a mounting ring 270 which is co-axial to the light-guiding bar 27. Each of the mounting ring 270 extends into the groove 104 of a corresponding one of the plugs 10 such that the light-emitting diodes 21 are surrounded by the corresponding mounting rings 270.

FIG. 19 is a schematic sectional diagram showing a lighting device according to an eleventh embodiment of the present invention.

As shown in FIG. 19, unlike to the tenth embodiment, a plurality of air bubbles 271 is formed inside the light-guiding bar 27 such that light emitted from the diodes 21' is reflected out of the housing 11 by the air bubbles 271.

It should be noted that, the light-guiding bar 27 can also be used in the above embodiments. On the other hand, an aforementioned fluorescent layer can also be formed on the inner surface of the housing 11 in the fifth to ninth embodiment. Alternatively, inert gas such as xenon or liquid dye such as polarizing dye or fluorochrome can also be used in other embodiment.

FIG. 20 is a schematic sectional diagram showing a lighting device according to a twelfth embodiment of the present invention.

Unlike to the eleventh embodiment, a plurality of elongated air bubbles 271' is formed inside the light-guiding bar 27. Each of the air bubbles 271' has an inclined reflective surface with respect to an adjacent one of the diodes 21' for reflecting light emitted from the adjacent one of the diodes 21' out of the housing 11. It should be noted that, as shown in the drawing, the closer the center of the light-guiding bar 27, the larger the air bubble 271' is, such that light emitted from the diodes 21' can be reflected averagely throughout the light-guiding bar 27.

What is claimed is:

1. A lighting device, comprising:
a light-guiding rod including a transparent hollow housing having two open ends and two insulating plugs for closing corresponding said two open ends, each of said plugs having an inner surface and a supporting slot formed on said inner surface; and
a light-emitting unit, including
a transparent light-guiding plate disposed in said housing and having two end portions each extending into said supporting slot of a corresponding one of said plugs,
at least one light-emitting diode, said at least one light-emitting diode having a light-emitting surface attached to a lower surface of said light-guiding plate, a non-light-emitting surface opposed to said light-emitting surface, and a plurality of electric contacts provided on said non-light-emitting surface,
a mounting substrate having a wiring surface and a plurality of electric traces formed on said wiring surface, and
a plurality of conductive bumps for connecting electrically said electric contacts of said at least one light-emitting diode to corresponding said electric traces in such a manner that said at least one light-emitting diode is mounted on said wiring surface of said mounting substrate.

2. A lighting device as claimed in claim 1, wherein said housing has an inner surface and a fluorescent layer formed on said inner surface.

3. A lighting device as claimed in claim 1, wherein each of said plugs has a body portion outside said housing, a horizontally-extending portion extending from an inner surface of said body portion into said housing, and a pair of through-holes penetrating said body portion and said horizontally-extending portion, said light-emitting unit further including two pairs of power supply electrodes, each power supply electrode of each pair of power supply electrodes extending through a corresponding one of said though-holes in such a manner that one end portion of said electrode extends inside said housing and other end portion of said electrode extends outside said housing, said electric traces on said wiring surface of said mounting substrate connected electrically to said end portions of corresponding said electrodes inside said housing via conductors.

4. A lighting device as claimed in claim 3, wherein said horizontally-extending portion of each of said plugs is formed with said supporting slot, said light-guiding plate having a round top surface, each of said end portions of said light-guiding plate having an outwardly-extending tab extending into said supporting slot of a corresponding one of said plugs in order to fix said light-guiding plate in said housing.

5. A lighting device, comprising:
a light-guiding rod including a transparent hollow housing having two open ends and two insulating plugs for closing corresponding said two open ends, each of said plugs having an inner surface and a supporting slot formed on said inner surface; and
a light-emitting unit, including
a transparent light-guiding plate disposed in said housing and having two end portions each extending into said supporting slot of a corresponding one of said plugs, said light-guiding plate having a lower surface and a plurality of electric traces formed on said lower surface,
at least one light-emitting diode, said at least one light-emitting diode having a light-emitting surface and a plurality of electric contacts provided on said light-emitting surface, and
a plurality of conductive bumps for connecting electrically said electric contacts of said at least one light-emitting diode to corresponding said electric traces on said lower surface of said light-guiding plate in such a manner that said at least one light-emitting diode is mounted on said lower surface of said light-guiding plate.

6. A lighting device as claimed in claim 5, wherein said housing has an inner surface and a fluorescent layer formed on said inner surface.

7. A lighting device as claimed in claim 5, wherein each of said plugs has a body portion outside said housing, a horizontally-extending portion extending from an inner surface of said body portion into said housing, and a pair of through-holes penetrating said body portion and said horizontally-extending portion, said light-emitting unit further including two pairs of power supply electrodes, each power supply electrode of each pair of power supply electrodes extending through a corresponding one of said though-holes in such a manner that one end portion of said electrode extends inside said housing and other end portion of said electrode extends outside said housing, said traces on said wiring surface of said mounting substrate connected electrically to said end portions of corresponding said electrodes inside said housing via conductors.

8. A lighting device as claimed in claim 7, wherein said horizontally-extending portion of each of said plugs is formed with said supporting slot, said light-guiding plate having a round top surface, each of said end portions of said light-guiding plate having an outwardly-extending tab extending into said supporting slot of a corresponding one of said plugs in order to fix said light-guiding plate in said housing.

9. A lighting device, comprising:
   a light-guiding rod including a transparent hollow housing having two open ends and two insulating plugs for closing corresponding said two open ends; and
   a light-emitting unit, including
   at least one mounting substrate having a wiring surface, a plurality of electric traces formed on said wiring surface, and a back surface which is opposed to said wiring surface and which is attached to an inner surface of a corresponding one of said plugs,
   at least one light-emitting diode, said at least one light-emitting diode having a light-emitting surface, a non-light-emitting surface opposed to said light-emitting surface, and a plurality of electric contacts provided on said light-emitting surface, and
   a plurality of conductive bumps for connecting electrically said electric contacts of said at least one light-emitting diode to corresponding said electric traces on said wiring surface of said mounting substrate in such a manner that said at least one light-emitting diode is mounted on said wiring surface of said mounting substrate.

10. A lighting device as claimed in claim 9, wherein each of said plugs has a body portion outside said housing, a horizontally-extending portion extending from an inner surface of said body portion into said housing, and a pair of through-holes penetrating said body portion and said horizontally-extending portion, said light-emitting unit further including two pairs of power supply electrodes, each power supply electrode of each pair of power supply electrodes extending through a corresponding one of said though-holes in such a manner that one end portion of said electrode extends inside said housing and other end portion of said electrode extends outside said housing, said traces on said wiring surface of said mounting substrate connected electrically to said end portions of corresponding said electrodes inside said housing via conductors.

11. A lighting device as claimed in claim 10, wherein said inner surface of said horizontally-extending portion of each of said plugs is formed with an annular groove, said light-emitting unit further including a transparent light-guiding bar, said light-guiding bar having two end portions and two annular flanges extending outwardly from corresponding said end portions into said annular grooves of corresponding said plugs in such a manner that said light-guiding bar is fixed in said housing and that each of said light-emitting diodes is surrounded by a corresponding one of said annular flanges.

12. A lighting device as claimed in claim 11, wherein said light-guiding bar has a plurality of air bubbles formed therein for reflecting light emitted from said at least one light-emitting diode out of said housing.

13. A lighting device as claimed in claim 9, wherein said housing is filled with inert gas.

14. A lighting device as claimed in claim 9, wherein said housing is filled with liquid dye or fluorochrome.

15. A lighting device as claimed in claim 9, wherein said housing is filled with optical fibers, each of said fibers having one end provided with fluorescent material.

16. A lighting device as claimed in claim 9, wherein said light-emitting unit further includes at least one light-reflecting cup, said at least one light-reflecting cup is provided on said at least one mounting substrate in such a manner that said at least one light-emitting diode is located in a central portion of said at least one light-reflecting cup.

* * * * *